(12) United States Patent
Wu

(10) Patent No.: US 10,910,413 B2
(45) Date of Patent: Feb. 2, 2021

(54) METHOD OF MANUFACTURING ARRAY SUBSTRATE AND ARRAY SUBSTRATE

(71) Applicants: HKC CORPORATION LIMITED, Shenzhen (CN); CHONGQING HKC OPTOELECTRONICS TECHNOLOGY CO., LTD., Chongqing (CN)

(72) Inventor: Chuan Wu, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/313,094

(22) PCT Filed: Nov. 29, 2018

(86) PCT No.: PCT/CN2018/118056
§ 371 (c)(1),
(2) Date: Dec. 24, 2018

(87) PCT Pub. No.: WO2020/073451
PCT Pub. Date: Apr. 16, 2020

(65) Prior Publication Data
US 2020/0119059 A1 Apr. 16, 2020

(30) Foreign Application Priority Data
Oct. 10, 2018 (CN) .......................... 2018 1 1180175

(51) Int. Cl.
*H01L 27/12* (2006.01)
*H01L 27/02* (2006.01)

(52) U.S. Cl.
CPC ...... *H01L 27/1259* (2013.01); *H01L 27/0292* (2013.01); *H01L 27/124* (2013.01); *H01L 27/1248* (2013.01)

(58) Field of Classification Search
CPC ............. H01L 27/1259; H01L 27/1248; H01L 27/0292; H01L 27/124; H01L 29/78669
See application file for complete search history.

(56) References Cited

U.S. PATENT DOCUMENTS

| 2011/0024750 A1* | 2/2011 | Yamazaki | ......... G02F 1/136227 257/57 |
| 2016/0154263 A1* | 6/2016 | Hatsumi | ............. H01L 27/1225 349/12 |

\* cited by examiner

*Primary Examiner* — Thanh T Nguyen

(57) ABSTRACT

The present disclosure provides a method of manufacturing array substrate, including: providing a substrate; and forming a metal layer, a gate layer, an insulation layer, and a protective layer on the substrate sequentially. Wherein, the metal layer is formed on a drive line on the substrate, and the metal layer is arranged in at least one of a position between the substrate and the insulation layer and a position between the insulation layer and the protective layer. In the present disclosure, an electrostatic discharge path is increased through the floating metal layer. Even though the floating metal layer is burned down, a display quality would not be affected, the product yield is improved. Besides, it only needs to adjust a photomask pattern. Therefore, a production procedure needs not to be adjusted.

14 Claims, 11 Drawing Sheets

METHOD OF MANUFACTURING ARRAY SUBSTRATE AND ARRAY SUBSTRATE

CROSS-REFERENCE TO RELATED APPLICATION

This application is the PCT Application No. PCT/CN2018/118056 for entry into US national phase, with an international filing date of Nov. 29, 2018 designating US, and claims priority to Chinese Patent Application No. 201811180175.X, filed on Oct. 10, 2018, and titled "method of manufacturing array substrate and array substrate", the content of which is incorporated herein by reference in entirety.

TECHNICAL FIELD

The present disclosure pertains to the field of display technology, and particularly to a method of manufacturing array substrate and an array substrate.

RELATED ART

Flat panel display devices have various advantages such as a wide color gamut and power saving, and are widely used in various fields. An existing flat panel display device mainly includes a LCD (Liquid Crystal Display), an OLED (Organic Light Emitting Diode) display device and a QLED (Quantum Dot Light Emitting Diode) display device. A TFT (Thin Film Transistor) may be formed on a glass substrate or a plastic substrate, is generally used as an active switch and is one of important components of the flat panel display device. With the development of display technology, there are more and higher requirements such as anti-static performance for display panels and display devices. Due to the fact that some products have high sensitivity, requirements on anti-static performance of components such as active switch are extremely high.

In a production and manufacturing processes of the TFT, a plurality of film layers having different functions are coated on an array substrate, and different film layers are completed in different mechanical devices and reaction chambers. Generally, in a film coating process and a substrate delivery process, the contact of the substrate with other medium causes massive electrostatic charges. These electrostatic charges stack on the array substrate. When the electrostatic charges come into contact with the delivery device, a relatively large electric potential difference is formed, and the film layer near a contact point is further punctured, so that the quality of a flat display panel or a flat panel display device is severely affected.

SUMMARY

An object of the present disclosure is to provide a method of manufacturing array substrate, which solves the technical problems including but not limited to reducing electrostatic stacking on an array substrate and improving a quality of a flat display panel or a flat panel display device.

A technical solution adopted in an embodiment of the present disclosure is: a method of manufacturing array substrate, including:
providing a substrate, where the substrate has a preset arrangement range of a source line;
providing a metal layer arranged on the substrate and configured to be disposed within the preset arrangement range;
providing a gate layer configured to be arranged on the substrate;
providing an insulation layer arranged on the substrate and configured to cover the metal layer and the gate layer;
providing an active layer configured to be arranged on the insulation layer; and
providing a protective layer arranged on the insulation layer and configured to cover the active layer.

In one embodiment, the metal layer and the gate layer are disposed at an interval.

In one embodiment, the gate layer and the metal layer are disposed perpendicular to each other.

In one embodiment, the metal layer and the gate layer are formed in a same process.

In one embodiment, a distance between the metal layer and the adjacent gate layer is between 3 micrometers and 20 micrometers.

In one embodiment, the metal layer is a floating gate layer or a floating electrode layer.

In one embodiment, the active layer is arranged at an intersection of the gate line and the source line.

In one embodiment, the active layer includes a source layer or a drain layer.

In one embodiment, the active layer includes a source layer and a drain layer.

Another object of the present disclosure is to provide a method of manufacturing array substrate, including:
providing a substrate;
providing a gate layer, where the gate layer is configured to be disposed above the substrate;
providing an insulation layer configured to be arranged on the substrate and cover the gate layer;
providing a metal layer configured to be arranged on the insulation layer and located above the gate layer;
providing an active layer configured to be arranged on the insulation layer; and
providing a protective layer, where the protective layer is configured to cover the metal layer and the active layer.

In one embodiment, the metal layer and the active layer are formed in a same process.

In one embodiment, the metal layer and the gate layer are arranged at an interval.

In one embodiment, a distance between the metal layer and the adjacent active layer is between 3 micrometers and 20 micrometers.

In one embodiment, the metal layer is a floating gate layer or a floating electrode layer.

In one embodiment, the active layer includes a source layer and a drain layer.

Another object of the present disclosure provides an array substrate, including:
a substrate;
an insulation layer configured to be arranged on the substrate;
a metal layer configured to be arranged on the substrate, where the insulation layer is configured to cover the metal layer;
a gate layer configured to be arranged on the substrate, where the insulation layer is configured to cover the gate layer; and
an active layer configured to be arranged on the insulation layer.

In one embodiment, the array substrate further includes a protective layer configured to be arranged on the insulation layer and is configured to cover the active layer.

In one embodiment, the gate layer and the metal layer are arranged at an interval.

In one embodiment, a distance between the metal layer and the gate layer is between 3 micrometers and 20 micrometers.

BRIEF DESCRIPTION OF THE DRAWINGS

In order to explain the technical solutions in embodiments of the present disclosure more clearly, the accompanying drawings used for describing the embodiments or the prior art are introduced briefly below. It is obvious that, the accompanying drawings are only some embodiments of the present disclosure, for ordinarily skilled one in the art, other drawings can still be obtained according to these drawings without paying creative efforts.

DESCRIPTIONS OF THE EMBODIMENTS

In order to make the purpose, the technical solution and the advantages of the present disclosure be clearer and more understandable, the present disclosure is further described in detail below with reference to accompanying figures and embodiments. It should be understood that the specific embodiments described herein are merely intended to illustrate but not to limit the present disclosure.

It should be noted that, when one component is described to be "fixed to" or "arranged on" another component, this component may be directly or indirectly arranged on another component. When one component is described to be "connected with" another component, it may be directly or indirectly connected to the other component. Orientation or position relationships indicated by terms including "upper", "lower", "left" and "right" are based on the orientation or position relationships shown in the accompanying figures and is only used for the convenience of description, instead of indicating or implying that the indicated device or element must have a specific orientation and is constructed and operated in a particular orientation, and thus should not be interpreted as limitation to the present disclosure. For the person of ordinary skill in the art, the specific meanings of the aforesaid terms may be interpreted according to specific conditions. Terms of "the first" and "the second" are only for the purpose of describing conveniently and should not be interpreted as indicating or implying relative importance or impliedly indicating the number of indicated technical features. "Multiple/a plurality of" means two or more unless there is an additional explicit and specific limitation.

The technical solutions of the present disclosure are described in detail below with reference to the accompanying drawings and embodiments.

Figure 1A:
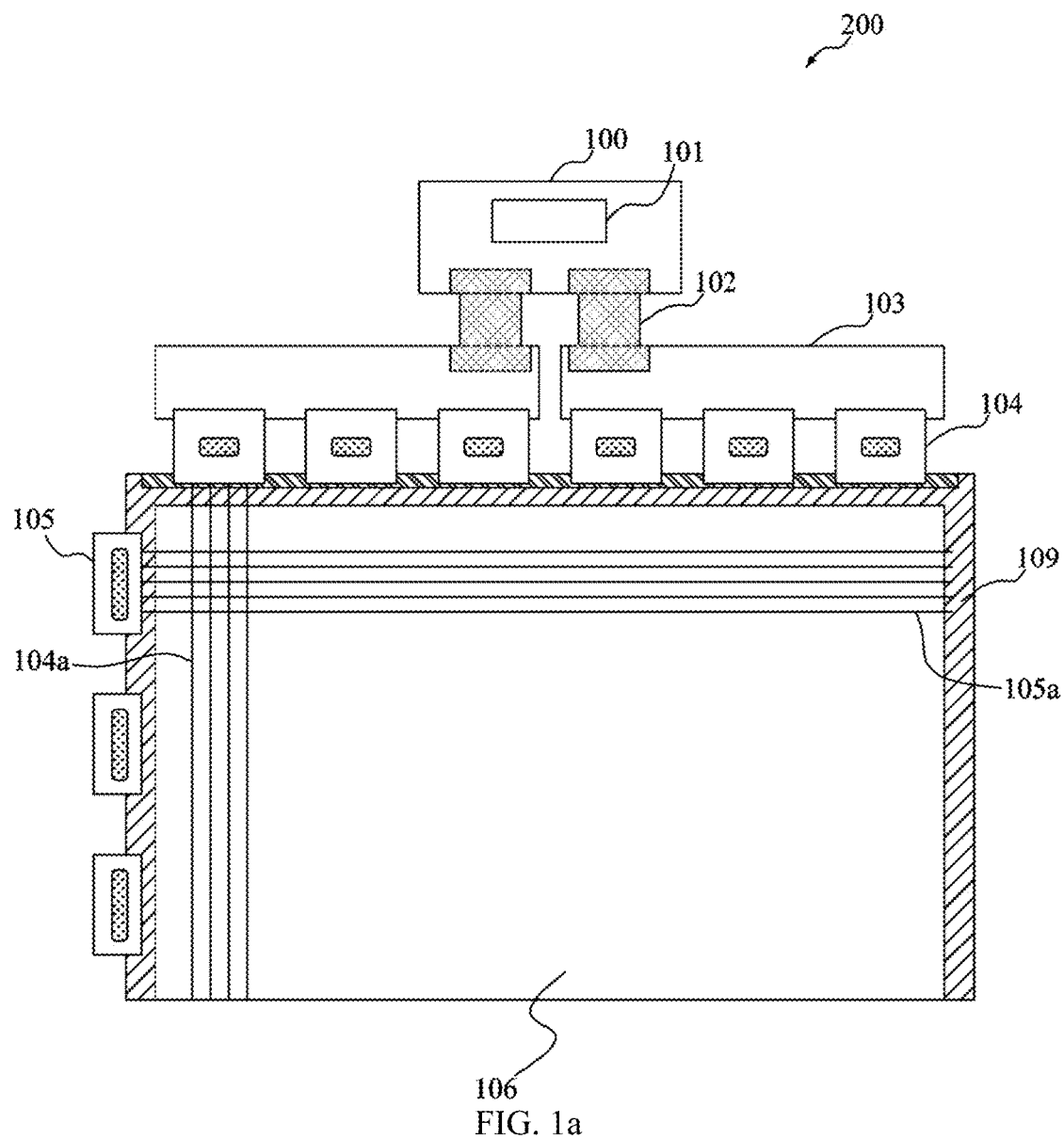
FIG. 1a is a schematic diagram of architecture of a display device according to an embodiment of the present disclosure.

FIG. 1a is an exemplary schematic diagram of an architecture of a display device. Referring to FIG. 1a, a display device 200 includes: a control board 100, where the control board 100 includes a timing controller 101; a printed circuit board 103 which is connected to the control board 100 through a FFC (Flexible Flat Cable) 102; and a source driver unit 104 and a gate driver unit 105 arranged in a cabling region 109 and respectively connected with a source line 104a and a gate line 105a in a display region. In one embodiment, the gate driver unit 105 and the source driver unit 104 are in a form of, including but is not limited to, a chip on film.

A drive manner of the display device 200 includes: a system main board provides a color (e.g., Red/Green/Blue) compression signal, a control signal, and power supply and transmits the color compression signal, the control signal and the power supply to the control board 100; after pre-processing the signals, the time controller 101 on the control board 100 transmits the signals and the power supply processed by a drive circuit to the gate driver unit 105 and the source driver unit 104 of the printed circuit board 103 through the FFC 102; and the gate driver unit 105 and the source driver unit 104 transmit necessary data and the power supply to the display region, so that the display device 200 obtains the power supply and the signal required for displaying an image.

Figure 1B:
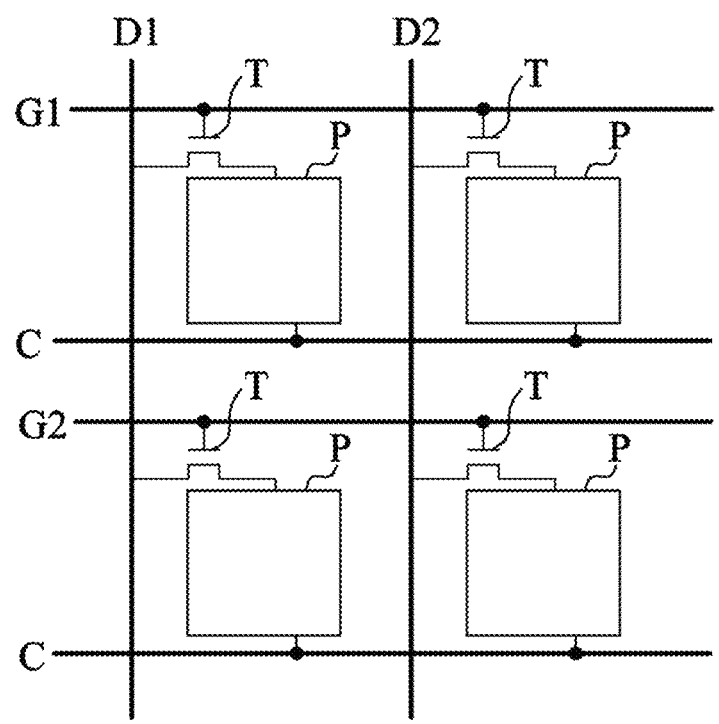
FIG. 1b is a schematic structural schematic diagram of a pixel unit according to an embodiment of the present disclosure.
Figure 1C:
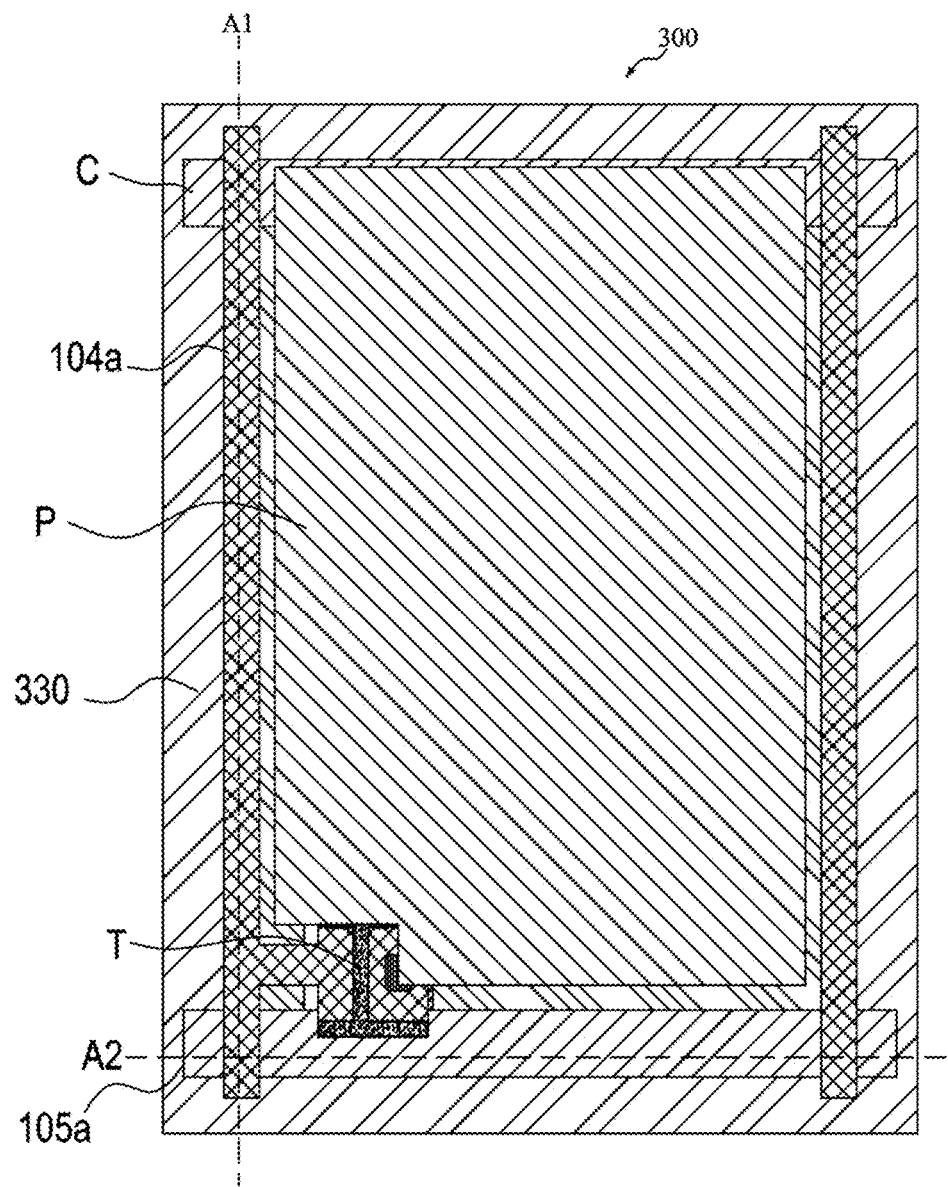
FIG. 1c is a schematic diagram of a configuration of a pixel unit of an array substrate according to an embodiment of the present disclosure.
Figure 1D:
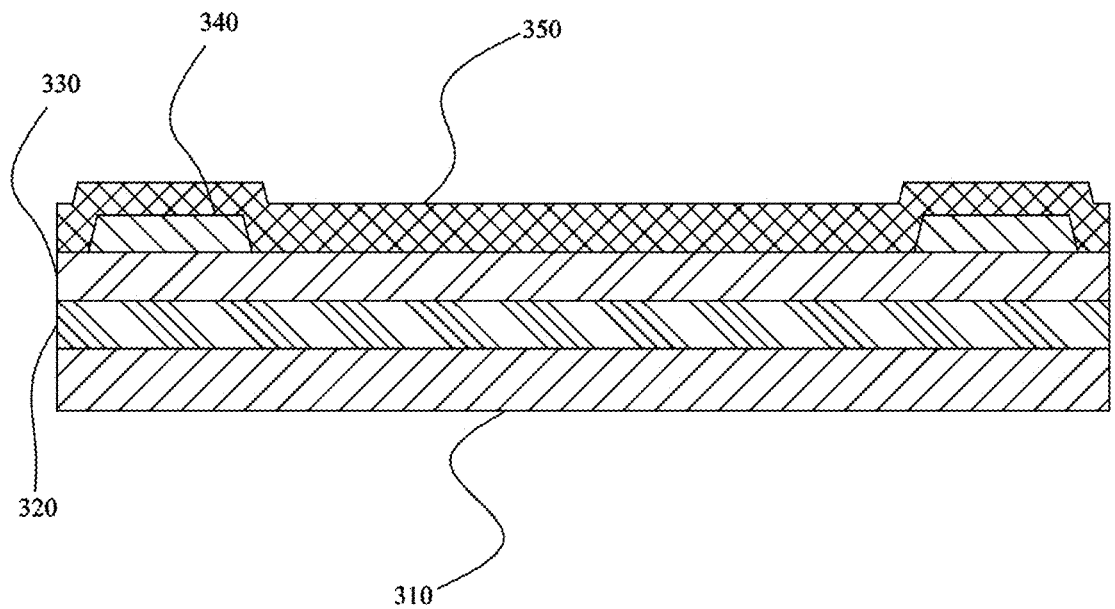
FIG. 1d is a cross-sectional view of FIG. 1c along line A1.
Figure 1E:
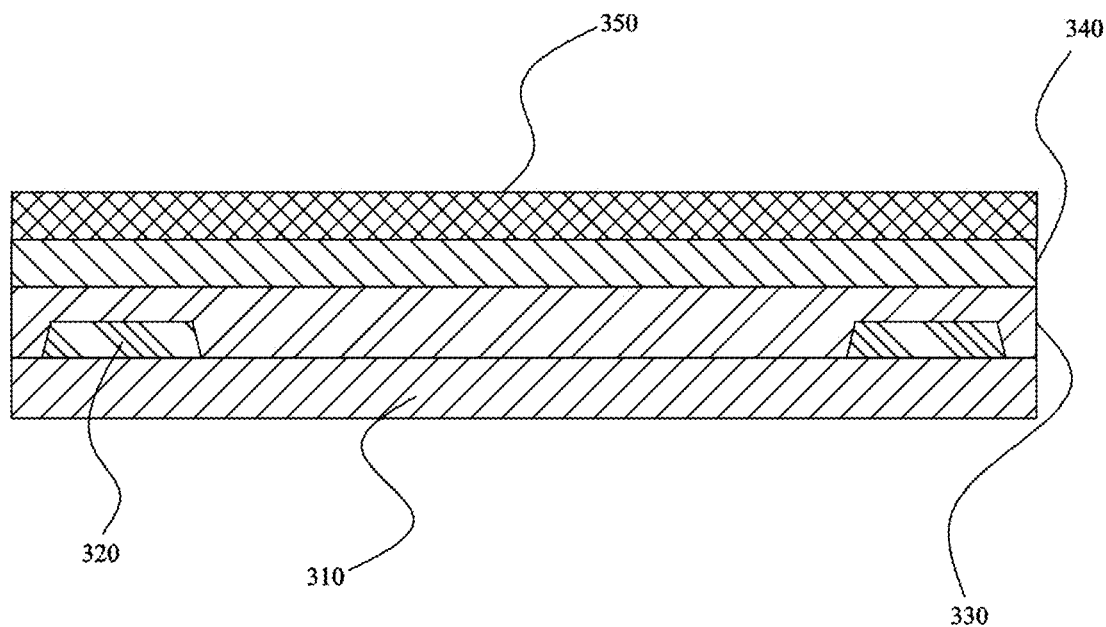
FIG. 1e is a cross-sectional view of FIG. 1c along line A2.

FIG. 1b is an exemplary partial view of an equivalent circuit of a pixel unit. FIG. 1c is an exemplary schematic diagram of a configuration of a pixel unit of an array substrate. FIG. 1d is a cross-sectional view of FIG. 1c along line A1. FIG. 1e is a cross-sectional view of FIG. 1c along line A2. For facilitating understanding of the present disclosure, please refer to both FIG. 1a and FIG. 1, an array substrate 300 includes a substrate 310, and the substrate is provided thereon with an active switch T, a gate line 105a, a source line 104a, and a pixel electrode P. The active switch T is electrically coupled with an intersection between the gate line 105a and the source line 104a, and the pixel electrode P is electrically coupled to the active switch T so as to form a capacitance with a shared path (Com) C. The gate line 105a includes a gate layer 320, an insulation layer 330, and a protective layer 350 by starting from the substrate 310. The source line 104a includes an insulation layer 330, an active layer 340 and a protective layer 350 by starting from the substrate 310.

However, in a production and manufacturing processes of a display panel, the contacting of the substrate 310 with other medium causes massive electrostatic charges, and after being absorbed by a metal layer, the electrostatic charges are transmitted to a relatively thin position of the film layer such as an overlapping position between the gate layer 320 and the active layer 340 or a channel of the active layer 340 to be discharged. When the electrostatic charges come into contact with a delivery device, a relatively large electric potential difference is formed, and then a film layer near a contact point is punctured, and the quality of the display panel or a display device is affected.

Figure 2A:
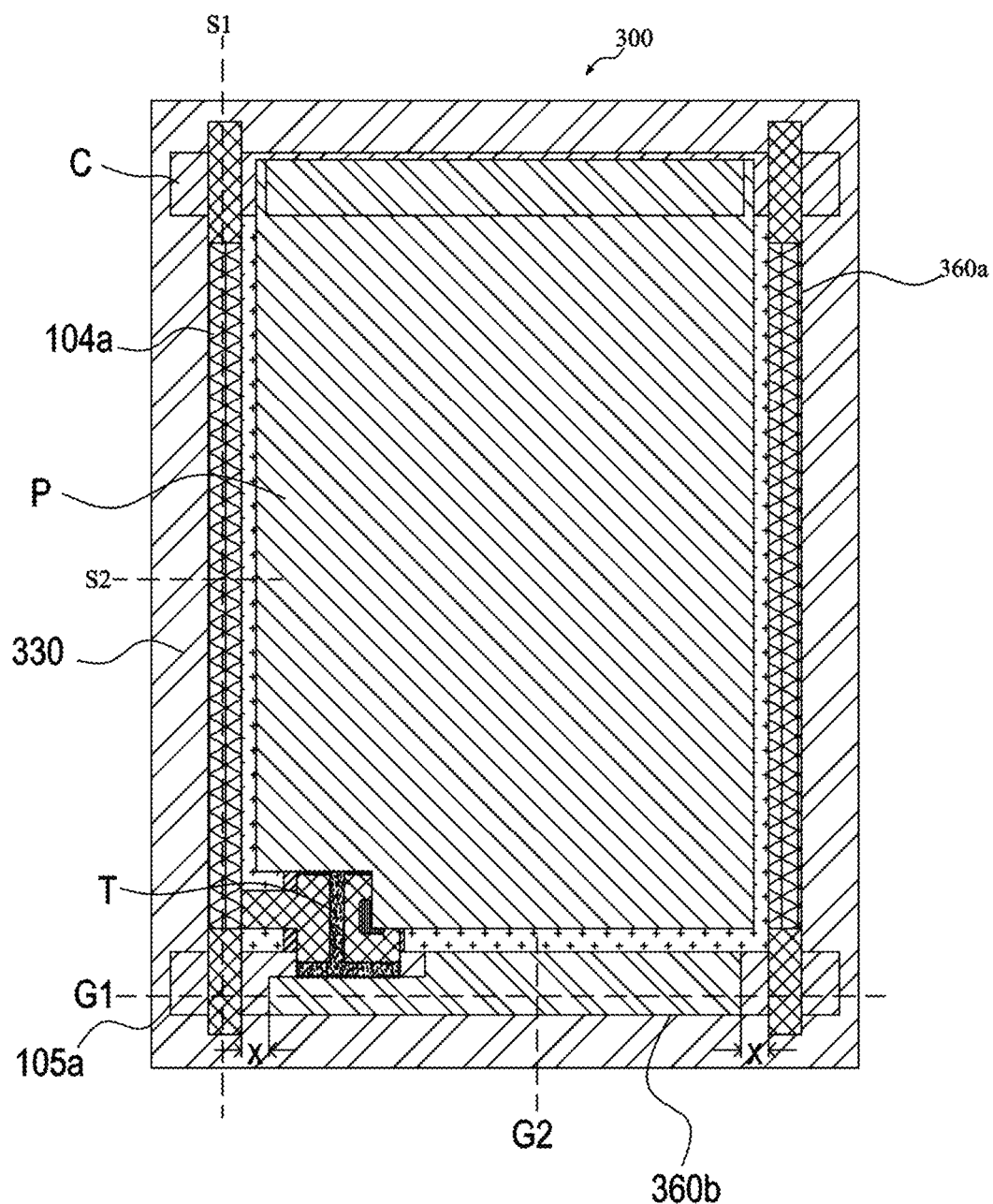
FIG. 2a is a schematic diagram of a pixel region of an array substrate according to an embodiment of the present disclosure.
Figure 2B:
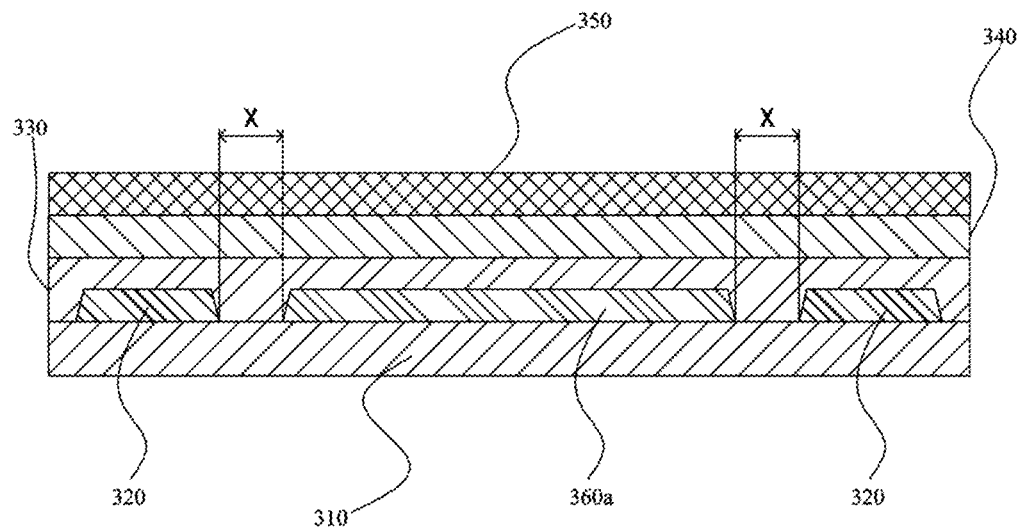
FIG. 2b is a schematic sectional view of a source line in FIG. 2a along a line S1.
Figure 2C:
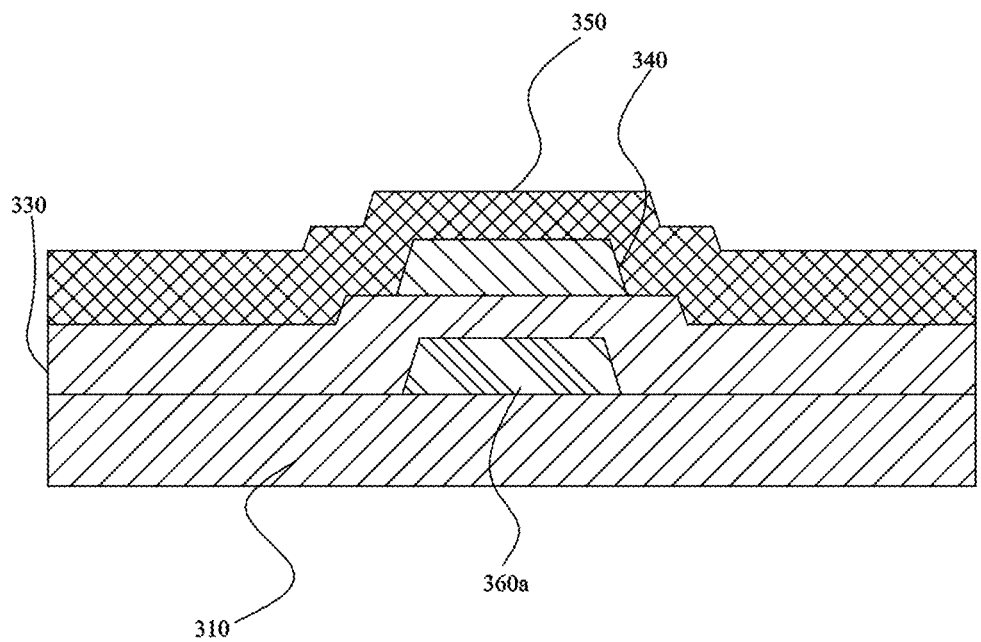
FIG. 2c is a schematic sectional view of a source line in FIG. 2a along a line S2.
Figure 2D:
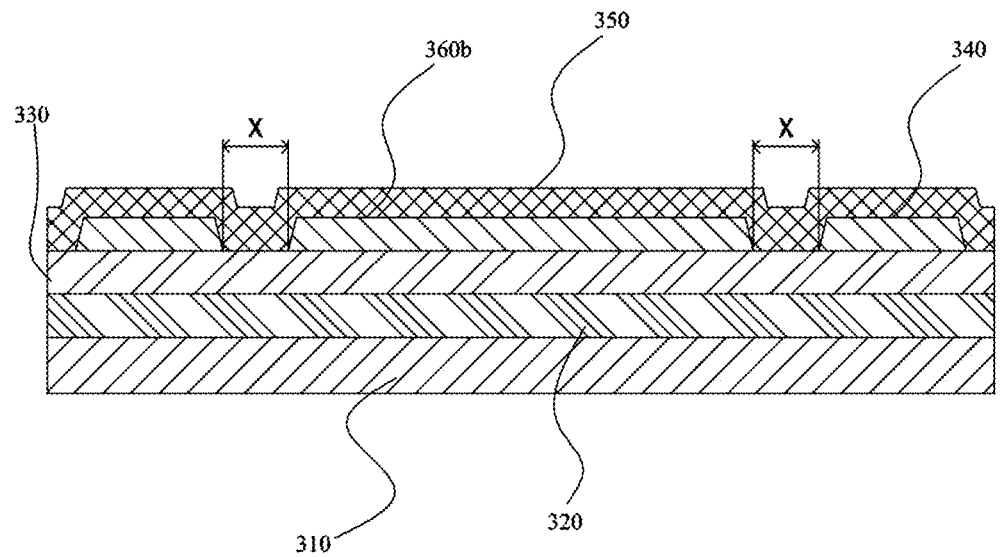
FIG. 2d is a schematic sectional view of a source line in FIG. 2a along a line G1.
Figure 2E:
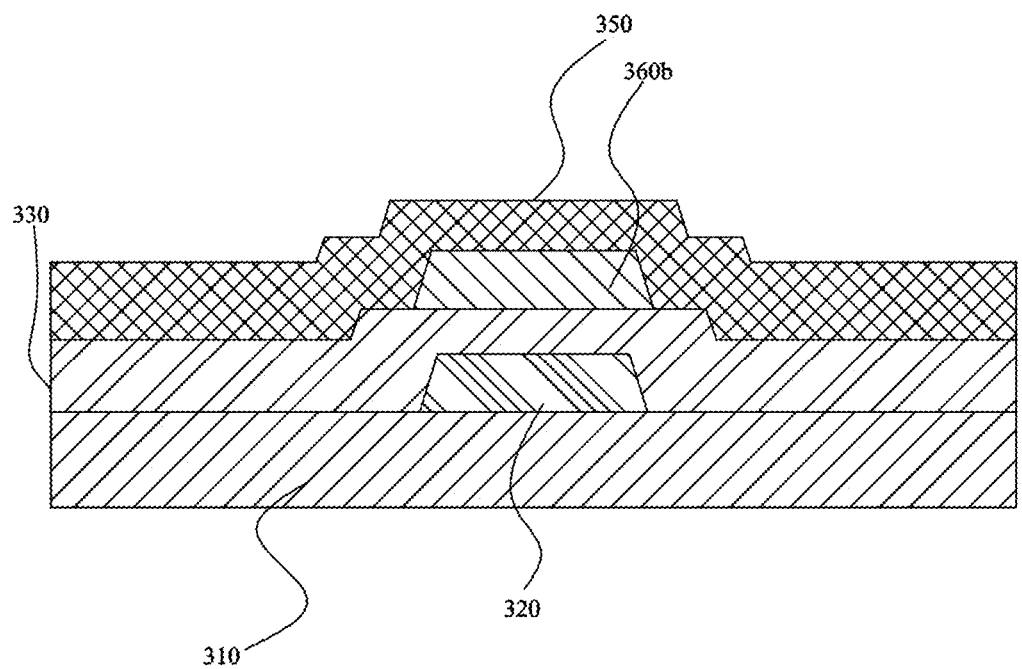
FIG. 2e is a schematic sectional view of a source line in FIG. 2a along a line G2.

FIG. 2a is a schematic diagram of a pixel region of an array substrate according to an embodiment of the present disclosure. FIG. 2b is a schematic sectional view of a source line in FIG. 2a along a line S1. FIG. 2c is a schematic sectional view of a source line in FIG. 2a along a line S2. FIG. 2d is a schematic sectional view of a source line in FIG. 2a along a line G1. FIG. 2e is a schematic sectional view of a source line in FIG. 2a along a line G2. For facilitating understanding of an exemplary device architecture and components of the device, please refer to FIG. 1a to FIG. 1e. Referring to FIG. 2a, in an embodiment of the present disclosure, an array substrate 300 includes: a substrate 310, where the substrate 310 includes a display region, a plurality of active switches T and a plurality of pixel electrodes P are arranged in the display region, and the plurality of pixel electrodes P is electrically coupled to the plurality of active switches T; and a plurality of drive line segments arranged on the substrate 310 and electrically coupled with the plurality of active switches T. Each drive line segment includes: an insulation layer 330 arranged on the substrate 310 and a protective layer 350 arranged on the substrate 310, where the protective layer 350 covers the insulation layer 330; and metal layers (360a, 360b) disposed within the coverage of the drive line segment. The metal layers (360a, 360b) are arranged to be floating. The "floating" in the present disclosure is "ungrounded". The metal layer is disposed in at least one of a position between the substrate 310 and the insulation layer 330 and a position between the insulation layer 330 and the protective layer 350.

In this embodiment of the present disclosure, the floating metal layer of a drive line is added to increase an adsorption and discharge path of electrostatic charges, so that the electrostatic charges generated in a manufacture process can be more dispersed, and an electric potential difference is reduced. Even though the floating metal layer is electrostatic, the floating metal layer is caused to be burned down, the display quality won't be affected, and the product yield is improved. Since the metal layer is disposed in at least one of the position between the substrate and the insulation layer and the position between the insulation layer and the protective layer, and may be manufactured with the drive line of the array substrate at a same layer, so that the number of photomasks needs not to be increased. Thus, an existing production procedure may not be greatly changed, an original process requirement and product costs are maintained. Because that the production procedure needs not to be adjusted, there is no particular process requirement and difficulty, and the cost would not be increased, the product has great market competitiveness. In addition, an array cabling area need not to be increased, which is applicable to the existing various display panel designs as well as narrow-bezel panel design, thereby complying with the market and technology trends.

As shown in FIG. 2a, FIG. 2b, and FIG. 2c, in an embodiment, the drive line segment includes a source line 104a, an active layer 340 is arranged between the insulation layer 330 and the protective layer 350, and the metal layer 360a is arranged between the insulation layer 330 and the substrate 310.

In an embodiment, the metal layer 360a is a floating gate layer or a floating electrode layer.

In an embodiment, the drive line segment includes a gate line 105a, a gate layer 320 is provided at an intersection between the source line 104a and the gate line 105a, the gate layer 320 is arranged between the substrate 310 and the insulation layer 330, and the metal layer 360a is disposed adjacent to the gate layer 320.

In an embodiment, the metal layer 360a and two neighboring gate layers 320 are disposed at intervals, and a distance is set to x. A signal delay time is inversely proportional to the distance between the metal layer 360a and the gate layer 320. Therefore, the metal layer 360a and the gate layers 320 are disposed at intervals, so that the signal delay time is effectively decreased, and user experience is further ensured.

In an embodiment, the distance x is between 3 micrometers and 20 micrometers. The distance x is set to be between 3 micrometers and 20 micrometers, so that the signal display time is decreased while the thickness of the array substrate is ensured.

In an embodiment, the metal layer 360a and the gate layer 320 are disposed perpendicular to each other. In this way, an overlapping area between the metal layer 360a and the gate layer 320 can be decreased. The signal delay time is proportional to the overlapping area between the metal layer 360a and the gate layer 320. Therefore, the signal delay time can be effectively reduced.

In an embodiment, the active layer 340 includes a source layer and a drain layer.

As shown in FIG. 2a, FIG. 2d, and FIG. 2e, in an embodiment, the drive line segment includes a gate line 105a, a gate layer 320 is arranged between the insulation layer 330 and the substrate 310, and the metal layer is arranged between the insulation layer 330 and the protective layer 350.

In an embodiment, the metal layer 360b is a floating active layer or a floating electrode layer.

In an embodiment, the drive line segment includes a source line 104a, an active layer 340 is arranged at an intersection between the gate line 105a and the source line 104a, the active layer 360b is arranged between the insulation layer 330 and the protective layer 350, and the metal layer 360b is arranged between two adjacent active layers 340.

In an embodiment, the metal layer 360b and the two adjacent gate layers 340 are arranged at intervals, and a distance is set to x. A signal delay time is inversely proportional to the distance between the metal layer 360b and the gate layer 340. Therefore, the metal layer 360b and the gate layer 340 are disposed at intervals, so that the signal delay time is effectively decreased, and user experience is further ensured.

In an embodiment, the distance x is between 3 micrometers and 20 micrometers. The distance x is set to be between 3 micrometers and 20 micrometers, so that the signal display time is decreased while the thickness of the array substrate is ensured.

Figure 3:
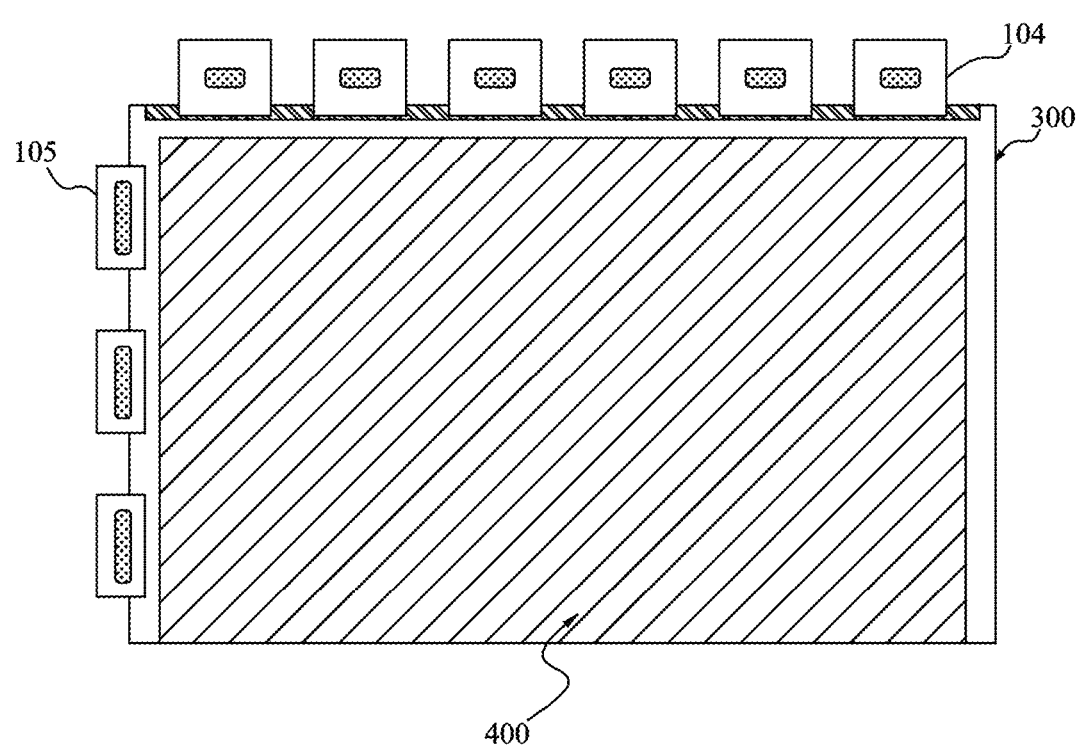
FIG. 3 is a schematic diagram of a display panel according to an embodiment of the present disclosure.

FIG. 3 is a schematic diagram of a display panel according to an embodiment of a method in the present disclosure. For facilitating understanding of the present disclosure, please refer to FIG. 2a to FIG. 2e. Regarding the components of the existing display device, please refer to FIG. 1a to FIG. 1e simultaneously. In an embodiment of the present disclosure, the display panel includes: an array substrate 300; and an opposite substrate 400 arranged to be opposite to the array substrate 300. The opposite substrate 400 may be a color filter substrate. Alternatively, a color filter is arranged on the array substrate 300, and the opposite substrate 400 is a matching substrate for configuring necessary components. The array substrate 300 includes: a substrate 310, where the substrate 310 includes a display region, a plurality of active switches T and a plurality of pixel electrodes P are arranged in the display region, and the plurality of pixel electrodes P are electrically coupled to the plurality of active switches T; a plurality of drive line segments arranged on the substrate 310 and electrically coupled to the plurality of active switches T. Each drive line segment includes: an insulation layer 330 arranged on the substrate 310; a protective layer 350 arranged on the substrate 310, where the protective layer 350 covers the insulation layer 330; metal layers (360a, 360b) arranged within the coverage of the drive line segment. The metal layers (360a, 360b) are set to be floating, and the metal layers (360a, 360b) are disposed in at least one of a position between the substrate 310 and the insulation layer 330 and a position between the insulation layer 330 and the protective layer 350.

In an embodiment, the array substrate 300 further includes various implementations above.

Referring to FIG. 2a to FIG. 2e, in an embodiment of the present disclosure, an array substrate 300 includes: a substrate 310, including a display region, where a plurality of active switches T and a plurality of pixel electrodes P are configured in the display area, and the plurality of pixel electrodes P is electrically coupled to the plurality of active switches T; a plurality of source lines 104a arranged on the substrate 310 and electrically coupled to the plurality of active switches T, where each source line 104a includes: an insulation layer 330 arranged on the substrate 310; an active layer 340 arranged between the insulation layer 330 and a protective layer 350; and the protective layer 350 arranged on the substrate 310 and covering the insulation layer 330 and the active layer 340; and a plurality of gate lines 105a arranged on the substrate 310 and electrically coupled to the plurality of active switches T, where each gate line 105a includes: a gate layer 320 arranged on the substrate 310; an insulation layer 330 arranged on the gate layer 320; a protective layer 350 arranged on the substrate 310 and covering the insulation layer 330; and metal layers (360a, 360b), disposed within coverage of a drive line segment. The metal layers (360a, 360b) are set to be floating. The metal layers (360a, 360b) include a floating gate layer and a floating active layer. The floating gate layer (the metal layer 360a) is arranged between the substrate 310 and the insulation layer 330 within a range of the source line 104a, and is arranged adjacent to the gate layer 320. The floating active layer (the metal layer 360b) is arranged between the protective layer 350 and the insulation layer 330 within a range of the gate line 105a and is arranged between the two adjacent active layers 340. The active layer 340 includes at least one of a source layer and a drain layer. An interval between the metal layer 360a and the neighboring gate layer 320 is between 3 micrometers and 20 micrometers. An interval between the metal layer 360b and the adjacent active layer 340 is between 3 micrometers and 20 micrometers.

Figure 4:
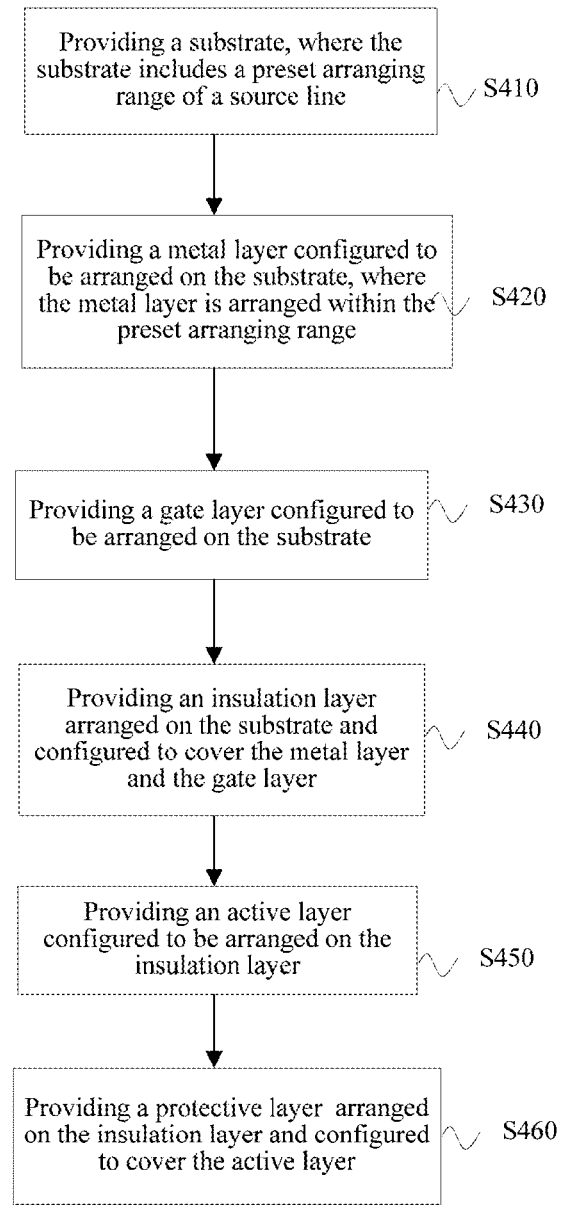
FIG. 4 is a schematic flowchart of a manufacturing process of an array substrate according to an embodiment of the present disclosure.

FIG. 4 is a schematic flowchart of a manufacturing process of an array substrate according to an embodiment of a method in the present disclosure. For facilitating understanding, please refer to FIG. 2a to FIG. 2c, in an embodiment of the present disclosure, taking a metal layer 360a arranged within the range of a source line 104a as an example, a method of manufacturing array substrate includes steps as follows:

Step 410: providing a substrate 310, where the substrate 310 includes a preset arrangement range of the source line.

Step 420: providing a metal layer 360a arranged on the substrate 310, where the metal layer 360a is arranged within the preset arrangement range of the source line 104a.

Step 430: forming a gate layer 320 arranged on the substrate 310.

Step S440: forming an insulation layer 330, where the insulation layer 330 is arranged on the substrate 310 and is configured to cover the metal layer 360a and the gate layer 320.

Step 450: forming an active layer 340 arranged on the insulation layer 330.

Step 460: forming a protective layer 350, where the protective layer 350 covers the active layer 340 and is arranged on the insulation layer 330.

In an embodiment, the metal layer 360a and the gate layer 320 are disposed perpendicular to each other.

In an embodiment, the metal layer 360a and the gate layer 320 are formed in a same process.

In an embodiment, the gate layer 320 and the metal layer 360a are disposed perpendicular to each other.

In an embodiment, there is a distance x between the metal layer 360a and the gate layer 320.

In an embodiment, the active layer 340 is arranged at an intersection between a gate line 105a and the source line 104a.

In an embodiment, the distance between the neighboring metal layer 360a and gate layer 105a is between 3 micrometers and 20 micrometers.

Figure 5:
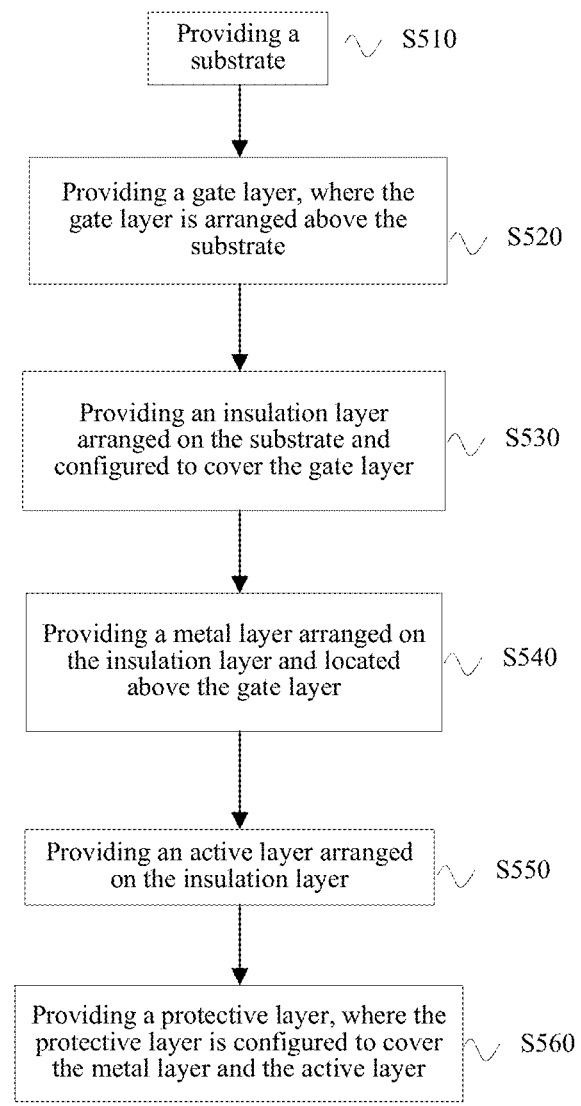
FIG. 5 is a schematic flowchart of a manufacturing process of an array substrate according to another embodiment of the present disclosure.

FIG. 5 is a schematic flowchart of a manufacturing process of an array substrate according to an embodiment of a method in the present disclosure. For facilitating understanding, please refer to FIG. 2a, FIG. 2d, and FIG. 2e. In an embodiment of the present disclosure, taking a metal layer 360b disposed within the range of a gate line 105a as an example, a method of manufacturing array substrate includes the steps as follows:

Step 510: providing a substrate 310.

Step 520: forming a gate layer 320 on the substrate 310.

Step 530: forming an insulation layer 330, where the insulation layer 330 covers the gate layer 320 and is arranged on the substrate 310.

Step 540: forming a metal layer 360b on the insulation layer 330, where the metal layer 360 is arranged on the insulation layer and is located above the gate layer 320.

Step 550: forming a protective layer 350, where the protective layer 350 covers the metal layer 360b and is arranged on the insulation layer 330.

An active layer 340 is formed, and the active layer 340 is arranged on the insulation layer 330.

In an embodiment, the metal layer 360b and the active layer 340 are formed in a same process.

In an embodiment, there is a distance x between the metal layer 360b and the active layer 340.

Figure 6:
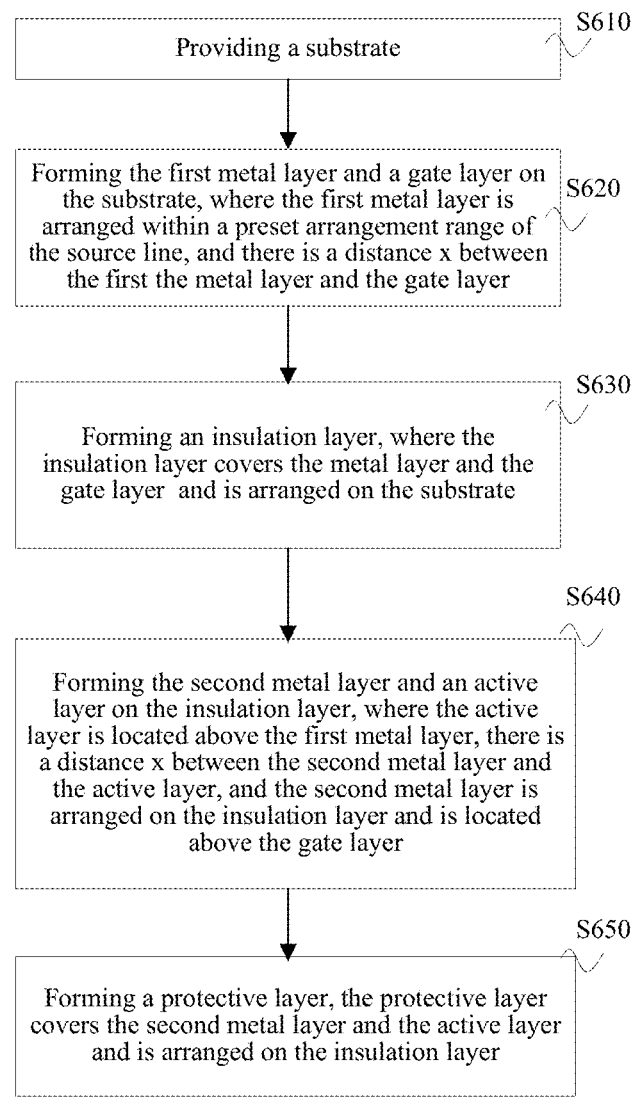
FIG. 6 is a schematic flowchart of a manufacturing process of an array substrate according to another embodiment of the present disclosure.

FIG. 6 is a schematic flowchart of a manufacturing process of an array substrate according to an embodiment of a method in the present disclosure. For facilitating understanding, please refer to FIG. 2a to FIG. 2c, in an embodiment of the present disclosure, taking a metal layer 360a (considered as a first the metal layer) arranged within a range of a source line 104a and a metal layer 360b (considered as a second the metal layer) arranged within a range of a gate line 105a as an example, a method of manufacturing array substrate includes the steps as follows:

Step 610: providing a substrate 310.

Step 620: forming the first metal layer 360a and a gate layer 320 on the substrate 310, where the first metal layer 360a is arranged within a preset arrangement range of the source line 104a, and there is a distance x between the first the metal layer 360a and the gate layer 320.

Step 630: forming an insulation layer 330, where the insulation layer 330 covers the metal layer 360a and the gate layer 320 and is arranged on the substrate 310.

Step 640: forming the second metal layer 360b and an active layer 340 on the insulation layer 330, where the active layer 340 is located above the first metal layer 360a, there is a distance x between the second metal layer 360b and the active layer 340, and the second metal layer 360b is arranged on the insulation layer 330 and is located above the gate layer 320.

Step 650: forming a protective layer 350, where the protective layer 350 covers the second metal layer 360b and the active layer 340 and is arranged on the insulation layer 330.

In an embodiment, the display panel in the present disclosure may be such as a liquid crystal display panel, but it is not limited thereto, the display panel may also be an OLED (Organic Liquid Crystal display) panel, a W-OLED (White Organic Liquid Crystal display) panel, a QLED (Quantum Dot Light Emitting Diode) display panel, a plasma display panel, a curved display panel, or be other types of display panels.

In the present disclosure, an adsorption and discharge path of electrostatic charges is increased by adding the floating metal layer 360a of the drive line, so that the electrostatic charges generated in a manufacture process may be more dispersed, and an electric potential difference is reduced. Even though static electricity occurs in the floating metal layer 360a, the floating metal layer 360a is caused to be burned down, the display quality would not be affected, and the product yield is improved. In the present disclosure, the number of photomasks needs not to be increased, and it only needs to draw the required layer correspondingly during design. Thus, the existing production procedure may not be greatly changed, an original process requirement and product cost are maintained. Because that the production procedure needs not to be adjusted, there is no particular process requirement and difficulty, and thus the cost is not increase, which leads to extreme market competitiveness. An array cabling area needs not to be increased according to the arrangement, which is applicable to the existing various display panel designs as well as the narrow-bezel panel design, thereby complying with market and technology trends. The foregoing is merely optional embodiments of the present disclosure and is not intended to limit the present disclosure.

A beneficial object of the present disclosure is to provide an array substrate, including:
  a substrate 310;
  a gate layer 320 configured to be arranged on the substrate 310;
  an insulation layer 330 configured to be arranged on the substrate 310 and covering the gate layer 320;
  an active layer 340 configured to be arranged on the insulation layer 330;
  a protective layer 350 configured to be arranged on the active layer 340; and
  a metal layer 360a configured to be arranged between the substrate 310 and the insulation layer 330 or between the insulation layer 330 and the protective layer 350.

In the present disclosure, by additionally arranging the floating metal layer 360a, a discharge path of electrostatic charges is increased, and the electrostatic charges generated in a manufacture process may be more dispersed, an electric potential difference is reduced. Even though static electricity occurs in the floating metal layer 360a c, which causes the floating metal layer 360a to be burned down, the display quality would not be affected, and the product yield is improved.

In an embodiment, the metal layer 360a is arranged between the substrate 310 and the insulation layer 330, and the gate layer 320 and the metal layer 360a are arranged at an interval.

In an embodiment, a distance between the neighboring metal layer 360a and gate layer 320 is between 3 micrometers and 20 micrometers.

In an embodiment, the metal layer 360a is arranged between the protective layer 350 and the insulation layer 330, and the active layer 340 and the metal layer 360a are disposed at an interval.

In an embodiment, a distance between the neighboring metal layer 360a and active layer 340 is between 3 micrometers and 20 micrometers.

For the ordinarily skilled one in the art, various modifications and variations can be made in the present disclosure. Any modification, equivalent replacement, or improvement made without departing from the spirit and principle of the present disclosure, should all be included in the scope of the claims of the present disclosure.

What is claimed is:

1. A method of manufacturing array substrate, comprising:
  providing a substrate;
  providing a metal layer arranged on the substrate, the metal layer comprises a first metal layer and a second metal layer;
  providing a gate layer arranged on the substrate;
  providing an insulation layer arranged on the substrate and configured to cover the metal layer and the gate layer;
  providing an active layer arranged on the insulation layer; and
  providing a protective layer arranged on the insulation layer and configured to cover the active layer, wherein the metal layer is arranged to be floating and ungrounded, the metal layer is disposed between the substrate and the insulation layer, or between the insulation layer and the protective layer, the gate layer and the first metal layer are disposed perpendicular to each other, the first the metal layer is arranged adjacent to the source line, and the second the metal layer is arranged adjacent to the gate line.

2. The method of manufacturing array substrate according to claim 1, wherein the metal layer and the gate layer are disposed at an interval.

3. The method of manufacturing array substrate according to claim 2, wherein the metal layer and the gate layer are formed in a same process.

4. The method of manufacturing array substrate according to claim 3, wherein a distance between the metal layer and the adjacent gate layer is between 3 micrometers and 20 micrometers.

5. The method of manufacturing array substrate according to claim 1, wherein in a step of providing a gate layer, the method further comprises a step of arranging a gate line, wherein the gate line is connected with the gate layer, and the active layer is arranged at an intersection between the gate line and the source line.

6. The method of manufacturing array substrate according to claim 1, wherein the active layer comprises a source layer or a drain layer.

7. The method of manufacturing array substrate according to claim 1, wherein the first metal layer is arranged between the substrate and the insulation layer, and the second metal layer is arranged between the insulation layer and the protection layer.

8. A method of manufacturing array substrate, comprising:
providing a substrate;
providing a gate layer disposed above the substrate;
providing an insulation layer arranged on the substrate and configured to cover the gate layer;
providing a metal layer arranged on the insulation layer and located above the gate layer, the metal layer comprises a first metal layer and a second metal layer;
providing an active layer arranged on the insulation layer; and
providing a protective layer configured to cover the metal layer and the active layer, wherein the metal layer is arranged to be floating and ungrounded, the metal layer is disposed between the substrate and the insulation layer, or between the insulation layer and the protective layer, the gate layer and the first metal layer are disposed perpendicular to each other, the first the metal layer is arranged adjacent to the source line, and the second the metal layer is arranged adjacent to the gate line.

9. The method of manufacturing array substrate according to claim 8, wherein the metal layer and the active layer are formed in a same process.

10. The method of manufacturing array substrate according to claim 9, wherein the metal layer and the gate layer are arranged at an interval.

11. The method of manufacturing array substrate according to claim 10, Wherein a distance between the metal layer and the adjacent active layer is between 3 micrometers and 20 micrometers.

12. The method of manufacturing array substrate according to claim 8, wherein the active layer comprises a source layer or a drain layer.

13. The method of manufacturing array substrate according to claim 8, wherein the active layer comprises a source layer and a drain layer.

14. The method of manufacturing array substrate according to claim 8, wherein the first metal layer is arranged between the substrate and the insulation layer, and the second metal layer is arranged between the insulation layer and the protection layer.

* * * * *